US006475638B1

(12) United States Patent
Mitsuhashi et al.

(10) Patent No.: US 6,475,638 B1
(45) Date of Patent: Nov. 5, 2002

(54) ELECTRODEPOSITED COPPER FOIL WITH ITS SURFACE PREPARED, PROCESS FOR PRODUCING THE SAME AND USE THEREOF

(75) Inventors: Masakazu Mitsuhashi; Yasuaki Mashiko; Hitoshi Kurabe, all of Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 90 days.

(21) Appl. No.: 09/654,769

(22) Filed: Sep. 5, 2000

(30) Foreign Application Priority Data

Sep. 6, 1999 (JP) ............................................. 11-252339

(51) Int. Cl.⁷ ......................... B32B 15/08; B32B 15/20; B24B 1/00; H05K 1/09; H05K 3/00
(52) U.S. Cl. ........................ 428/606; 428/607; 428/626; 428/612; 428/675; 428/687; 205/222; 174/256; 451/57
(58) Field of Search ................................ 428/606, 607, 428/626, 687, 612, 675; 205/76, 77, 222; 174/256, 257; 451/37, 57, 58

(56) References Cited

U.S. PATENT DOCUMENTS

| 5,096,522 A | * | 3/1992 | Kawachi et al. ............. 156/151 |
| 5,437,914 A | * | 8/1995 | Saida et al. ..................... 216/20 |
| 5,482,784 A | * | 1/1996 | Ohara et al. ................. 205/111 |
| 5,545,466 A | * | 8/1996 | Saida et al. .................. 156/233 |
| 5,858,517 A | * | 1/1999 | Tagusari et al. ............. 205/111 |
| 5,897,761 A | * | 4/1999 | Tagusari et al. ............. 205/111 |
| 6,291,081 B1 | * | 9/2001 | Kurabe et al. ............... 174/257 |

FOREIGN PATENT DOCUMENTS

| EP | 0 785 295 A1 | * | 7/1997 |
| EP | 1 083 248 A2 | | 3/2001 |
| JP | 3-296238 | | 12/1991 |
| JP | 05160208 | | 6/1993 |
| JP | 09195096 | | 7/1997 |

OTHER PUBLICATIONS

*Metals Handbook Ninth Edition*, vol. 5, "Surface Cleaning, Finishing, and Coating" © Oct. 1982, American Society for Metals, p. vii (3 pp.).

Derwent Abstract Accession No. 94–327968/41, Class V04, JP 06–252548 A, (Furukawa Electric Co. Ltd.), Sep. 9, 1994.

* cited by examiner

*Primary Examiner*—John J. Zimmerman
(74) *Attorney, Agent, or Firm*—Webb Ziesenheim Logsdon Orkin & Hanson, P.C.

(57) ABSTRACT

A process for producing an electrodeposited copper foil with its surface prepared, comprising the steps of: subjecting an electrodeposited copper foil having a shiny side and a matte side whose average surface roughness (Rz) is in the range of 2.5 to 10 μm to at least one mechanical polishing so that the average surface roughness (Rz) of the matte side becomes in the range of 1.5 to 3.0 μm; and subjecting the matte side having undergone the mechanical polishing to a selective chemical polishing so that the average surface roughness (Rz) of the matte side becomes in the range of 0.8 to 2.5 μm. The invention further provides an electrodeposited copper foil with its surface prepared, produced by the above process, and still further provides PWBs and a multilayer laminate of PWBs, produced with the use of the above electrodeposited copper foil with its surface prepared. The mechanical polishing followed by chemical polishing of the matte side enables obtaining an electrodeposited copper foil with its surface prepared, the matte side of which exhibits excellent properties, and hence enables obtaining PWBs and a multilayer PWBs which have excellent properties.

34 Claims, 7 Drawing Sheets

18μm-VLP (M Side)

1st Buff Polishing (M Side)

2nd Buff Polishing (M Side)

2nd Buff Polishing + Chemical Polishing

Surface after 2nd Buff Polishing + Chemical Polishing + Treatment

ELECTRODEPOSITED COPPER FOIL WITH ITS SURFACE PREPARED, PROCESS FOR PRODUCING THE SAME AND USE THEREOF

FIELD OF THE INVENTION

The present invention relates generally to an electrodeposited copper foil with its surface prepared wherein a matte side, namely a surface at which copper deposition is completed, is mechanically polished at least once and the thus mechanically polished matte side is subjected to a selective chemical polishing so as to attain preparing thereof, and relates to a process for producing the same and a use of the electrodeposited copper foil with its surface prepared in, for example, a printed wiring board.

BACKGROUND OF THE INVENTION

In recent years, both the size and weight of electronic equipment such as a notebook-sized personal computer are being reduced to increasing extents. Accordingly, IC wiring is also becoming finer.

With respect to the wiring pattern formed on a substrate used in such an electronic equipment, the lead width is now as small as ten-odd microns ($\mu$m). In accordance therewith, the metal foil constituting the wiring pattern is becoming thinner. Specifically, while the designated thickness of metal foil for use in the formation of the conventional wiring pattern of about 100 $\mu$m lead width has ranged from about 15 to 35 $\mu$m in correspondence to the width of the wiring pattern, the thickness of metal foil employed in the formation of ten-odd micron ($\mu$m) wiring pattern must be reduced in correspondence thereto.

For example, an aluminum foil or a copper foil is used as the metal foil for constituting the above wiring pattern. It is preferred to employ a copper foil, especially an electrodeposited copper foil, as the metal foil.

The electrodeposited copper foil employed for forming the above wiring pattern is produced by electrodepositing copper on a drum surface. With respect to the thus produced electrodeposited copper foil, the surface at which copper deposition is initiated, namely the surface at which formation of copper deposits brought into contact with the drum is initiated, is referred to as "shiny side", and the surface at which copper deposition is completed is referred to as "matte side". The surface condition of the shiny side is substantially the same as that of the drum. That is, the 10-point average surface roughness (Rz) in ISO 4287 of the drum is about from 1.2 to 2.5 $\mu$m, to which the 10-point average surface roughness (Rz) of the shiny side is nearly equal. On the other hand, with respect to the matte side, its surface roughness is greater than the surface roughness of the shiny side, and the 10-point average surface roughness of the matte side, although varied depending on the deposition condition of copper and the thickness thereof, is generally in the range of about 2.5 to 10 $\mu$m. In the conventional electrodeposited copper foil of about 35 $\mu$m nominal thickness, it has been rare that the surface roughness of the matte side poses a problem. However, in the electrodeposited copper foil of ten-odd micron ($\mu$m) thickness, the surface roughness of the matte side is equivalent to tens of percents of the thickness of the whole electrodeposited copper foil, and the condition of the matte side exerts marked influence on the electrical properties of formed wiring pattern and board per se. It is known that, for example, mechanical polishing, chemical polishing and electrolytic polishing are available as the means for preparing the state of surface of the copper foil. The mechanical polishing is a method of smoothing the surface of the copper foil with the use of, for example, a buff. When use is made of a thin copper foil, the copper foil may be broken by mechanical stress exerted on the copper foil. Thus, the mechanical polishing is suitable for the preparing of the surface of relatively thick copper foils. On the other hand, no mechanical stress is exerted on the copper foil in the chemical polishing and electrolytic polishing, as different from the mechanical polishing, so that even thin copper foils would not be broken by the chemical polishing and electrolytic polishing. Thus, it has been believed that the chemical polishing and electrolytic polishing are suitable for the preparing of the surface of relatively thin copper foils.

For example, Japanese Patent Unexamined Publication No. Hei 5-160208 discloses a tape carrier having a lead pattern formed from an electrodeposited copper foil wherein the overall surface of matte side obtained by electrodeposition has been polished. This publication discloses the use, in the formation of a lead pattern of 60 to 80 $\mu$m pitch, of an electrodeposited copper foil whose 1–2 $\mu$m of matte side surface profile has been chemically polished to thereby attain preparing of the matte side. The thickness of the there employed electrodeposited copper foil after the preparing is in the range of 18 to 30 $\mu$m. It is disclosed that a highly reliable carrier tape with desired lead strength can be provided by the use of the copper foil whose matte side overall surface has been chemically polished.

However, the preparing of copper foil by chemical polishing as described in the above publication, although protrudent parts of the matte side are leached with relatively high selectivity to thereby effect preparing thereof, also invites leaching of the copper constituting the depressed parts of the matte side. Therefore, in this chemical polishing, the whole copper foil tends to become thin. Accordingly, when the thin electrodeposited copper foil employed in conformity with the recent trend toward fine pitch, for example, the electrodeposited copper foil having a thickness of 35 $\mu$m (1 ounce), or 17.5 $\mu$m (½ ounce), or less is chemically polished to such an extent that a desired state of surface is attained, the whole electrodeposited copper foil is thinned to such an extent that the mechanical strength of wiring pattern or lead becomes poor. Further, this chemical surface polishing poses a problem such that it is difficult to control reaction conditions for chemical polishing so as to have the matte side uniformly treated. These problems of chemical polishing also occur in the electrolytic polishing involving leaching of copper.

In this connection, Japanese Patent Application Publication (Unexamined) No. Hei 3-296238 discloses a method of producing a TAB tape having a wiring pattern formed from a non-treated copper foil. The average surface roughness of the non-treated copper foil is described as falling within the range of 0.01 to 1 $\mu$m.

However, the non-treated copper foil whose average surface roughness (Rz) falls within the range of 0.01 to 1 $\mu$m, disclosed in this publication, is a rolled copper foil. The surface roughness of this non-treated rolled copper foil is too low to ensure satisfactory peel strength (bonding strength). Accordingly, it is needed to preheat the copper foil or increase the diameter of the roller so as to form a covering thin film of cuprous oxide on the surface of the rolled copper foil. This poses a problem such that the process becomes laborious. Further, the use of this rolled copper foil renders it difficult to form a wiring pattern of extremely fine pitch such as one of from 30 $\mu$m to less than 60 $\mu$m pitch width.

Still further, Japanese Patent Unexamined Publication No. Hei 9-195096 discloses an invention directed to an electrodeposited copper foil for printed wiring board wherein the surface roughness (Rz) of the matte side of electrodeposited copper foil prior to nodulating treatment is not greater than 1.5 μm while the surface roughness (Rz) after nodulating treatment on the matte side is in the range of 1.5 to 2.0 μm. This electrodeposited copper foil is described as being producible by a method comprising buffing the matte side of an electrodeposited copper foil so as to cause the surface roughness (Rz) prior to roughening treatment to become in the range of 1.5 μm or less and subsequently effecting a roughening treatment on the matte side so as to cause the surface roughness (Rz) to become in the range of 1.5 to 2 μm.

However, the buffing of electrodeposited copper foil at a stretch as described in this publication may cause streaks on the buffed surface. These streaks result from polishing made deeper than predetermined. Some streaks have not posed any problem when use is made of the conventional thick electrodeposited copper foils. However, these streak portions are formed by excess polishing of copper, so that, when use is made of thin copper foils, the depth of streak portions is extremely large. Thus, these are likely to become the cause of defective occurrence, for example, high possibility of open circuit at such portions in a wiring pattern or the like. Furthermore, in the execution of such buffing, stress is exerted on protrudent parts of the copper foil surface along the direction of buff rotation, so that protrudent parts of the copper foil surface are likely to deform along the direction of buff rotation. It is difficult to effect uniform roughening treatment on the buffed copper foil having thus deformed protrudent parts. Nonuniform roughening treatment would invite problems such that the adherence to insulating films, etching uniformity, bonding reliability, etc. are deteriorated. These problems are likely to occur especially when thin electrodeposited copper foils are mechanically polished.

As apparent from the above, all the mechanical polishing, chemical polishing and electrolytic polishing methods, conventionally employed in the polishing of the matte side of the electrodeposited copper foil, have been highly useful for the polishing of electrodeposited copper foil for forming wiring patterns of 100 μm or more pitch. However, the single employment of the above conventional polishing methods in the polishing of the matte side of the electrodeposited copper foil used to produce a printed wiring board whose pitch is becoming tens of microns or less involves the highly probable danger of causing the formed wiring pattern to be brittle and hence tends to render it difficult to supply printed wiring boards having reliable properties.

OBJECT OF THE INVENTION

An object of the present invention is to provide an electrodeposited copper foil which is especially suitable for producing a printed wiring board of fine pitch and to provide a process for producing such an electrodeposited copper foil.

Another object of the present invention is to provide an electrodeposited copper foil with its matte side surface prepared, the preparing performed by a plurality of different polishing operations under extremely mild conditions in place of a single polishing operation to thereby realize a matte side surface prepared with high uniformity, and to provide a process for producing such an electrodeposited copper foil.

Further objects of the present invention are to provide a printed wiring board of stable quality produced with the use of the above electrodeposited copper foil with its surface prepared with high uniformity and to provide a multilayer laminate printed wiring board consisting of a laminate of such printed wiring boards.

SUMMARY OF THE INVENTION

The process for producing an electrodeposited copper foil with its surface prepared according to the present invention comprises the steps of:

subjecting an electrodeposited copper foil having a shiny side and a matte side whose average surface roughness (Rz) is in the range of 2.5 to 10 μm to at least one mechanical polishing so that the average surface roughness (Rz) of the matte side becomes in the range of 1.5 to 3.0 μm, and subjecting the matte side having undergone the mechanical polishing to a selective chemical polishing so that the average surface roughness (Rz) of the matte side becomes in the range of 0.8 to 2.5 μm.

The electrodeposited copper foil with its surface prepared according to the present invention is one having a shiny side and a prepared matte side whose average surface roughness (Rz) is in the range of 0.8 to 2.5 μm, the above prepared matte side obtained through the steps of subjecting a matte side of electrodeposited copper foil whose average surface roughness (Rz) is in the range of 2.5 to 10 μm to at least one mechanical polishing so that the average surface roughness (Rz) of the matte side becomes in the range of 1.5 to 3.0 μm, and subjecting the matte side having undergone the mechanical polishing to a selective chemical polishing so that the average surface roughness (Rz) of the matte side becomes in the range of 0.8 to 2.5 μm.

The prepared matte side surface of the electrodeposited copper foil with its surface prepared according to the present invention is preferably furnished with a roughened layer. A corrosion preventive layer is preferably disposed on the surface of the roughened layer, and a silane coupling agent layer is preferably disposed on the surface of the corrosion preventive layer.

The printed wiring board of the present invention comprises an insulating substrate having its surface furnished with a wiring pattern formed from an electrodeposited copper foil with its surface prepared, this electrodeposited copper foil with its surface prepared having a shiny side and a prepared matte side whose average surface roughness (Rz) is in the range of 0.8 to 2.5 μm, the prepared matte side obtained through the steps of subjecting a matte side of electrodeposited copper foil whose average surface roughness (Rz) in the range of 2.5 to 10 μm to at least one mechanical polishing so that the average surface roughness (Rz) of the matte side becomes in the range of 1.5 to 3.0 μm, and subjecting the matte side having undergone the mechanical polishing to a chemical polishing so that the average surface roughness (Rz) of the matte side becomes in the range of 0.8 to 2.5 μm.

The multilayer printed wiring board of the present invention comprises a laminate of a plurality of boards of given thickness, the above boards capable of being electrically connected to each other in the direction of the thickness of the laminate, each of the boards having its surface furnished with a wiring pattern formed from an electrodeposited copper foil with its surface prepared, this electrodeposited copper foil with its surface prepared having a shiny side and a prepared matte side whose average surface roughness (Rz) is in the range of 0.8 to 2.5 μm, the prepared matte side obtained through the steps of subjecting a matte side of electrodeposited copper foil whose average surface roughness (Rz) is in the range of 2.5 to 10 μm to at least one mechanical polishing so that the average surface roughness (Rz) of the matte side becomes in the range of 1.5 to 3.0 μm, and subjecting the matte side having undergone the mechanical polishing to a chemical polishing so that the average surface roughness (Rz) of the matte side becomes in the range of 0.8 to 2.5 μm.

In the present invention, it is preferable for the electrodeposited copper foil with its surface prepared that the sharp edges of the matte side have been substantially eliminated by the chemical polishing after at least one mechanical polishing.

The electrodeposited copper foil with its surface prepared, employed for forming the printed wiring board or the multilayer printed wiring board, preferably has its chemically polished matte side treated for roughening.

In the present invention, a copper-clad laminate comprises a substrate and the electrodeposited copper foil with is surface prepared which is laminated on the substrate.

There is a vast plurality of unevenness on the surface of the matte side of the electrodeposited copper foil, wherein, for example, protrudent part heights and depressed part depths are not fixed. The surface condition of the matte side is often expressed by the average surface roughness (Rz). As described later, the average surface roughness (Rz) is an average of depths of depressed parts and heights of protrudent parts constituting the surface of the matte side. Thus, on the matte side having a given average surface roughness (Rz), there is a multiplicity of protrudent parts whose roughness (Rmax) is greater than the average surface roughness (Rz). In the first step of the process for producing an electrodeposited copper foil with its surface prepared according to the present invention, mainly apex portions of the protrudent parts are mechanically removed by the mechanical polishing. Thus, the matte side is freed mainly of apex portions of the protrudent parts. In this mechanical polishing, stress is applied to portions to be polished so that, referring to, for example, FIG. 4(a), apex portions of the protrudent parts 112 are removed. Accordingly, there inevitably occurs a directionality along which mechanical polishing stress is applied. For example, referring to FIG. 4, when apex portions of the protrudent parts are polished by a rotary buff, stress is applied to the apex portions of the protrudent parts 112 in the same direction as the direction of buff rotation with the result that, as shown in FIG. 4(b), the protrudent part portion first brought into contact with the rotary buff is polished more easily than the side later brought into contact with the rotary buff. Furthermore, apex portions of the protrudent parts 112 are ground while being slightly deformed along the direction of stress application, so that polished upper portions of the protrudent parts may suffer from deformation corresponding to the stress exerted by the rotary buff or the like. For example, referring to FIG. 4(b), it has been found that the protrudent parts may be deformed along the direction of buff rotation with the result that shelf-shape deformations 111 are formed downstream in the direction of stress application.

As apparent from the above, stress is produced during the mechanical polishing, so that the mechanical polishing is inevitably accompanied by a directionality. Further, in the process of the present invention, it is intended to mainly polish and remove apex portions of the protrudent parts of the matte side by the mechanical polishing, but not to polish the whole surface of the matte side so as to render the surface specular. Rather, from the viewpoint of attaining stable bonding to the surface of an insulating substrate, it is preferred that the matte side surface be not completely smooth. Therefore, in the present invention, apex portions of the protrudent parts are mainly mechanically polished. However, referring to FIG. 4(b), this mechanical polishing forms boundary 120 between polished portion and portion not polished. When the matte side is directly subjected to the subsequent treatment for roughening, the states of being roughened may be different between the polished portion and the portion not polished.

Therefore, in the present invention, referring to FIG. 4(c), the matte side having undergone the above mechanical polishing is further chemically polished to thereby remove discontinuous polishing boundary 120 and instead create round curved surface 121. Moreover, performing the chemical polishing after the mechanical polishing can also correct the directionality of polished surface due to stress, generated during the mechanical polishing.

DETAILED DESCRIPTION OF THE INVENTION

Figure 1:
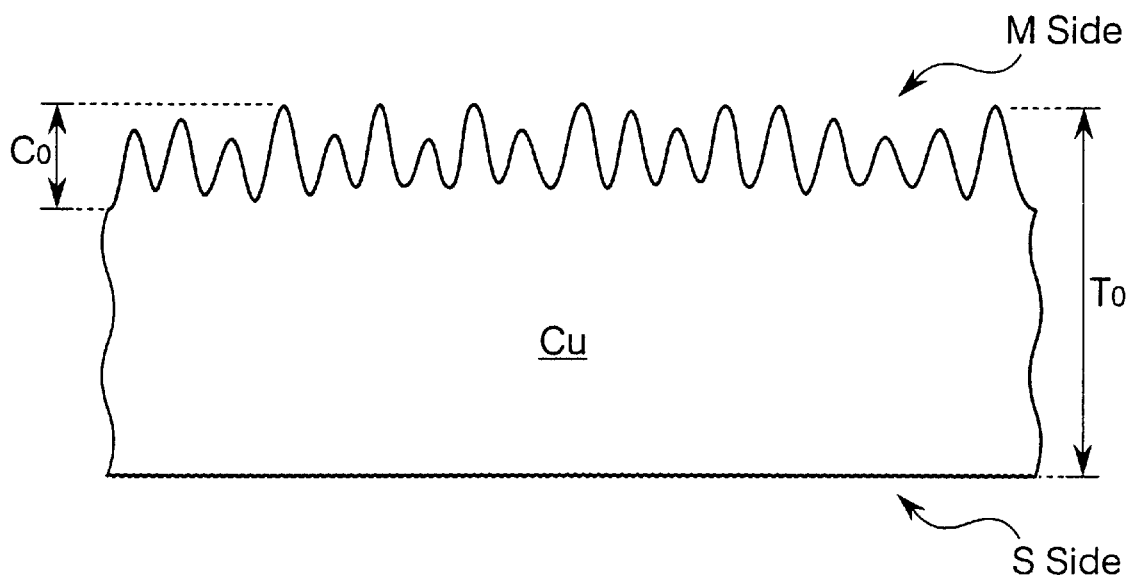
FIG. 1 is a schematic sectional view of one form of matte side of a conventional electrodeposited copper foil.

The electrodeposited copper foil with its surface prepared according to the present invention, along with the process for producing the same, will be described in detail below with reference to the drawings. In the drawings, like reference numerals are used to designate like or corresponding members, if possible, throughout the several views.

The electrodeposited copper foil prior to mechanical polishing for use in the present invention generally has a nominal thickness of 5 to 35 μm and an average surface roughness (Rz) of matte side ranging from about 2.5 to 10 μm, preferably about 3 to 8 μm. Even with respect to electrodeposited copper foils of small surface roughness, the average surface roughness (Rz) of matte side is in the range of about 3 to 7 μm. Examples of copper foils having such an average surface roughness (Rz) include VLP foil (average surface roughness (Rz): 3 to 5 μm) and HTE foil (average surface roughness (Rz): 4 to 7 μm).

Figure 2:
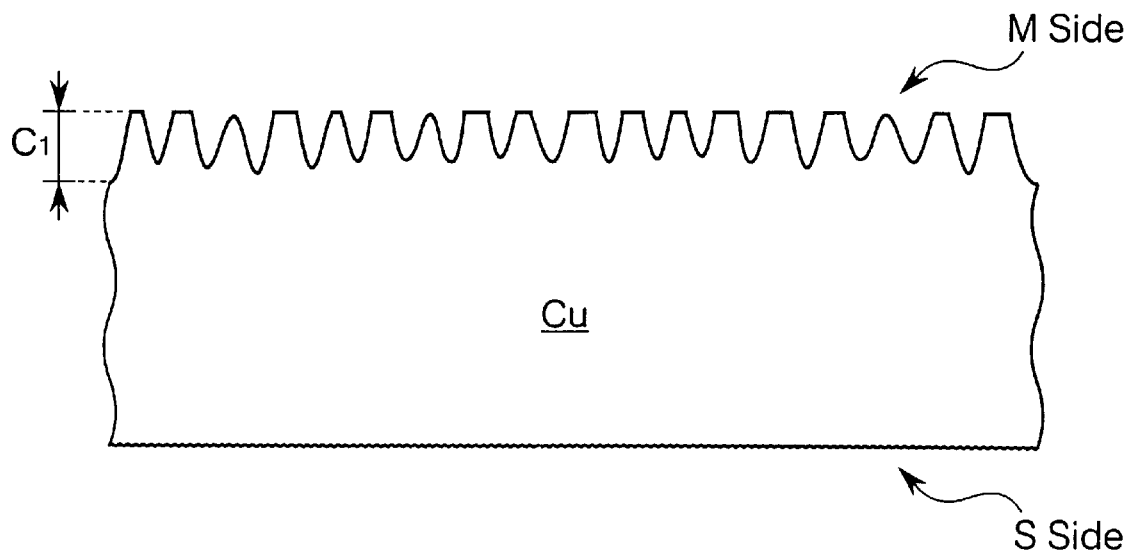
FIG. 2 is a schematic sectional view showing the state of the matte side having undergone buffing.
Figure 3:
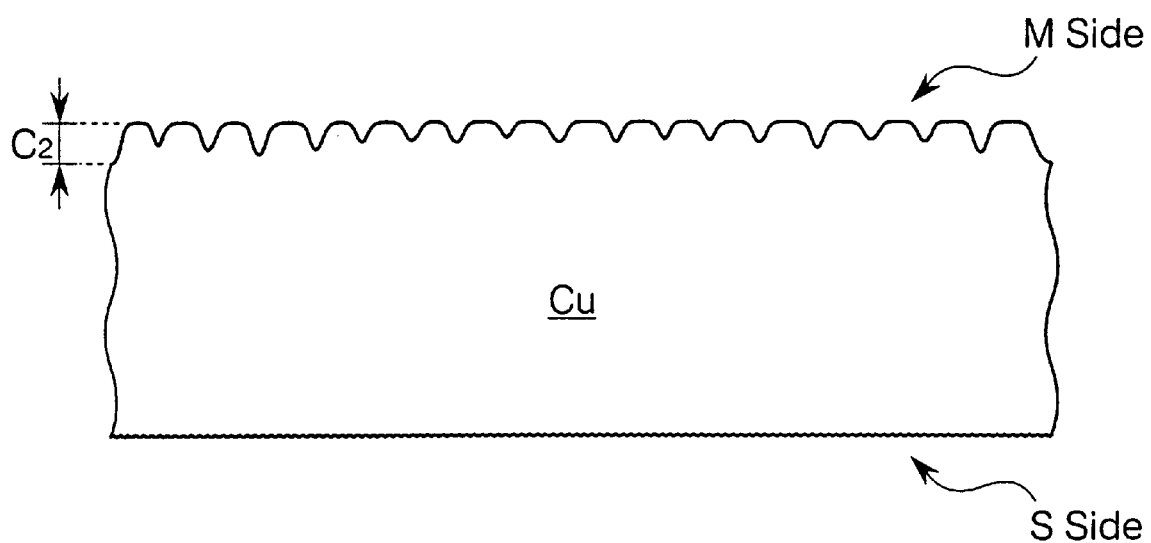
FIG. 3 is a schematic sectional view showing the state of the matte side having undergone buffing and subsequent chemical polishing.
Figure 4:
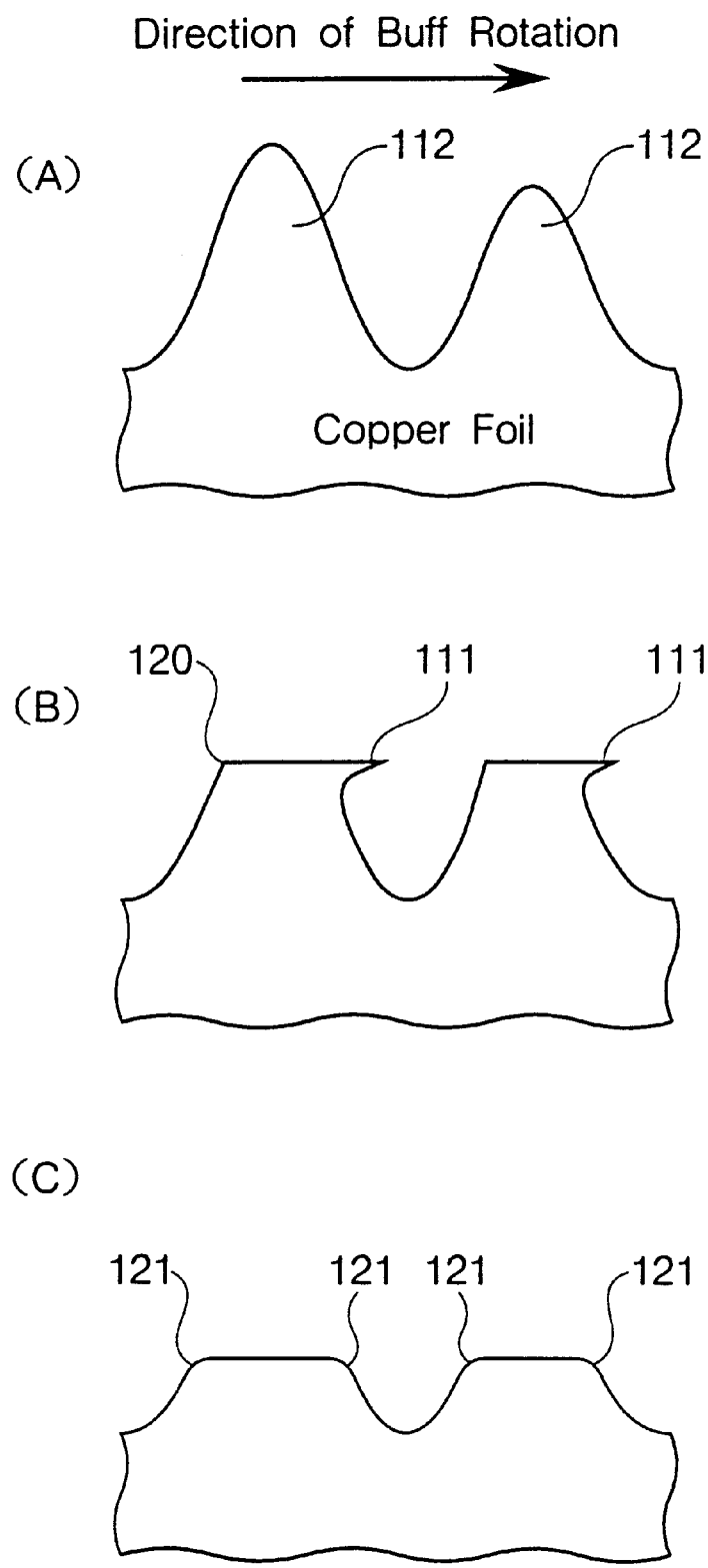
FIGS. 4(A)–(C) schematically show the deformation of protrudent parts made at buffing and after chemical polishing.
Figure 7:
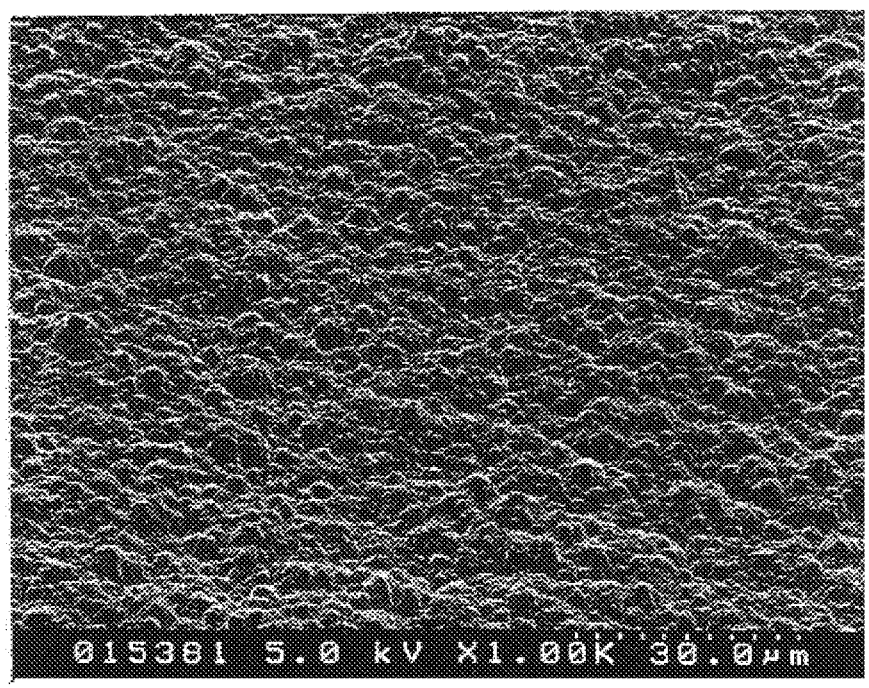
FIG. 7 is a Scanning Electron Micrometer (SEM) photo showing one form of the matte side of an electrodeposited copper foil before being subjected to the process of the present invention.

FIG. 1 is a sectional view schematically showing the common surface condition of the matte side of an electrodeposited copper foil (18 μm thick electrodeposited copper foil) having an average gauge thickness ($T_0$) of 18 μm and an average surface roughness ($Rz_0$) of 3.6 μm. FIG. 2 is a schematic sectional view of the electrodeposited copper foil having its surface prepared so as to have an average surface roughness ($Rz_1$) of 2.0 μm by a mechanical polishing. FIG. 3 is a schematic sectional view of the electrodeposited copper foil having its surface prepared so as to have an average surface roughness ($Rz_2$) of 1.5 μm with round shape by a chemical polishing. FIG. 7 is a SEM photo showing the state of matte side of the 18 μm thick electrodeposited copper foil prior to polishing.

In FIGS. 1 through 3, the designation "M side" means the matte side of the electrodeposited copper foil, and the designation "S side" means the shiny side of the electrodeposited copper foil. Referring to FIG. 1, generally, the average surface roughness (Rz) of the matte side is expressed by a 10-point average surface roughness (Rz). The 10-point average roughness (Rz) is, as shown in ISO 4287, an average of 10-points of five largest values and five smallest values selected from the specified lengths from depressed part bottom to protrudent part apex at a multiplicity of points of the matte side. The unevenness formed at the matte side is not uniform, and the distance from the deepest bottom of depressed parts to the highest apex of protrudent parts ($C_0$) is about 5 μm even in the electrodeposited copper foil whose average surface roughness ($Rz_0$) is 3.6 μm.

In the present invention, referring to FIG. 2, the mechanical polishing mainly polishes apex portions of the protrudent parts of the matte side. This mechanical polishing causes the average surface roughness ($Rz_1$) of the matte side of the electrodeposited copper foil to generally fall within the range of 1.5 to 3.0 μm, preferably 1.8 to 2.5 μm.

This mechanical polishing can be accomplished by the use of, for example, a rotary buff.

Specifically, while the electrodeposited copper foil to be polished is being passed through guide rolls, a rotary buff is pressed against the matte side thereof to thereby effect intended polishing.

In this buffing, the buff is rotated in a single direction at a rotating speed of generally 100 to 1500 rpm, preferably 1000 to 1300 μm, to thereby effect intended mechanical polishing. When the rotating speed of the buff is less than 100 rpm, it is difficult to uniformly polish the matte side to be polished. On the other hand, when the rotating speed is much greater than 1500 rpm, the buff rotation becomes unstable, so that the electrodeposited copper foil may be broken.

Although the press force exerted by the buff upon the electrodeposited copper foil to be polished in the buffing can be appropriately regulated so as to avoid breakage of the electrodeposited copper foil and simultaneously avoid excess polishing of the matte side by the buffing, it is generally preferred that the buff press force in terms of buff motor current value be set so as to fall within the range of 10.1 to 30 A (the buff motor current value at the time of non-load is about 10 A, so that the substantial press force of buffing (substantial press force in terms of current) in terms of buff motor current value is generally in the range of about 0.1 to 20 A). Still preferably, the substantial press force in terms of current is in the range of 13 to 18 A. When the substantial press force in terms of current is less than 0.1 A, either polishing of the electrodeposited copper foil may be ineffective, or the time required for polishing may be extremely prolonged. On the other hand, when the substantial press force in terms of current exceeds 20 A, breakage of the electrodeposited copper foil occurs frequently.

When the electrodeposited copper foil is mechanically polished by the above rotary buff, the speed at which the copper foil to be polished is moved, namely the line speed, is generally set so as to fall within the range of 3 to 15 m/min. This line speed may influence the uniformity of mechanical polishing. When the line speed goes outside the above range, it is likely for the uniformity of mechanical polishing to be deteriorated.

In the above mechanical polishing, for example, in the use of a buff, the type of employed polishing material is not particularly limited. Use can be made of, for example, a rotary buff of No. 800 to 3000 or so, having aluminum oxide bonded thereto.

In the process of the present invention, although one mechanical polishing is satisfactory, it is preferred to carry out at least two mechanical polishings. The reason is as follows. Since, in the mechanical polishing, the matte side of the electrodeposited copper foil is polished by, for example, a rotary buff brought into contact with the matte side, a relative mechanical polishing directionality is generated by the direction of rotation of the rotary buff and the direction of move of the electrodeposited copper foil. Thus, one mechanical polishing may induce, for example, protrudent part deformation along the direction of polishing (direction of buff rotation). The directionality of mechanical polishing thus generated on the matte side can be corrected to a certain extent by, after the first buffing, polishing by means of the second buff, which rotates in the direction reverse to that of the first buff, brought into contact with the matte side surface. Performing a plurality of mechanical polishings in place of one mechanical polishing enables reducing the polishing amount per mechanical polishing. Thus, the press force of each rotary buff can be set low, so that not only is the possibility of breakage of polished electrodeposited copper foil lowered but also the occurrence of polishing directionality in each mechanical polishing operation is suppressed.

When the mechanical polishing operation is thus dispersed, it is preferred that each mechanical polishing be performed under conditions set milder than those mentioned above. When rotary buffs are employed, it is preferred that the direction of rotation of the second buff be reverse to that of the first buff. Further, when use is made of a multiplicity of rotary buffs including further the third buff, the fourth buff and so on, it is preferred that the direction of rotation of a rotary buff be reverse to that of the preceding rotary buff. The buff grain size is preferably equal to or smaller than that of the preceding rotary buff.

The above polishing of the matte side of the electrodeposited copper foil with the use of a plurality of rotary buffs suppresses the occurrence of streaks. These streaks are attributed to excess grinding of the copper foil. The polishing in the manner such that no streaks are generated not only enables preventing the lowering of the mechanical strength of the wiring pattern formed with the use of this electrodeposited copper foil with its surface prepared but also suppresses conduction failure and other failures therein.

The above mechanical polishing selectively polishes relatively high apex portions of the protrudent parts of the matte side. For example, polishing is performed so as to attain a reduction of $C_0=5$ μm for which reference is made to FIG. 1 to $C_1=2.5$ to 3.2 μm for which reference is made to FIG. 2. That is, this mechanical polishing causes $C_1$ to attain a reduction of 17 to 36% relative to the $C_0$ prior to surface preparing. When the level of the thus performed mechanical polishing is evaluated by the average surface roughness (Rz), the average surface roughness (Rz) attained as a result of the mechanical polishing is in the range of 1.5 to 3.0 μm, preferably 1.8 to 2.5 μm. For example, with respect to the electrodeposited copper foil of FIG. 1, the original average surface roughness ($Rz_0$) is 3.8 μm, and the mechanical polishing reduces the same to an average surface roughness ($Rz_1$ of 2.0 μm as shown in FIG. 2. Thus, the mechanical polishing lowers the average surface roughness (Rz) by 17 to 47%.

In the present invention, as aforementioned, it is preferred that the mechanical polishing of the matte side be performed at least twice. When the mechanical polishing is performed at least twice, the polishings are effected so that the total mechanical polishing amount is as mentioned above.

Figure 8:
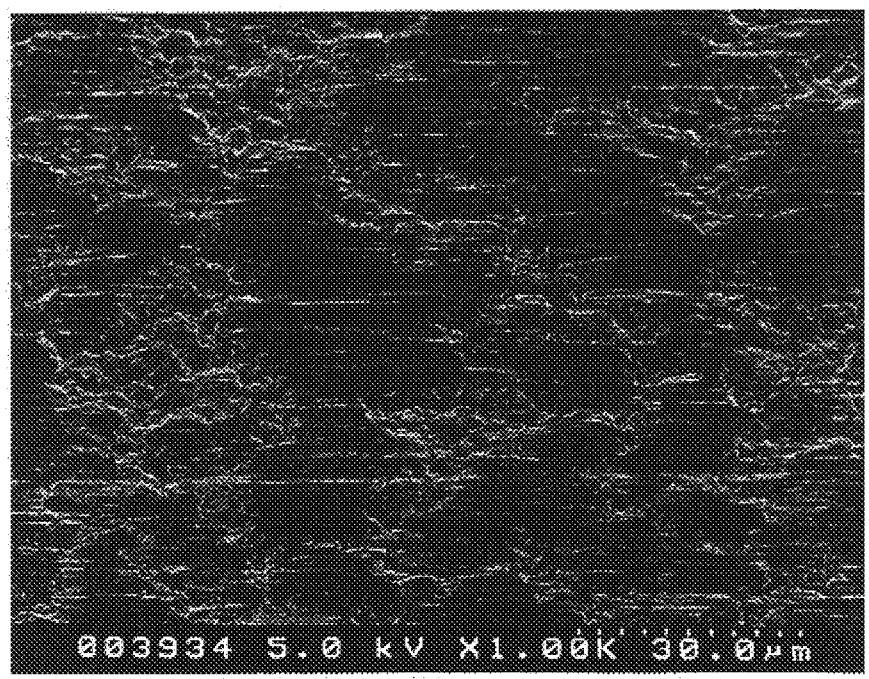
FIG. 8 is a SEM photo showing one form of the matte side having undergone the first mechanical polishing.
Figure 9:
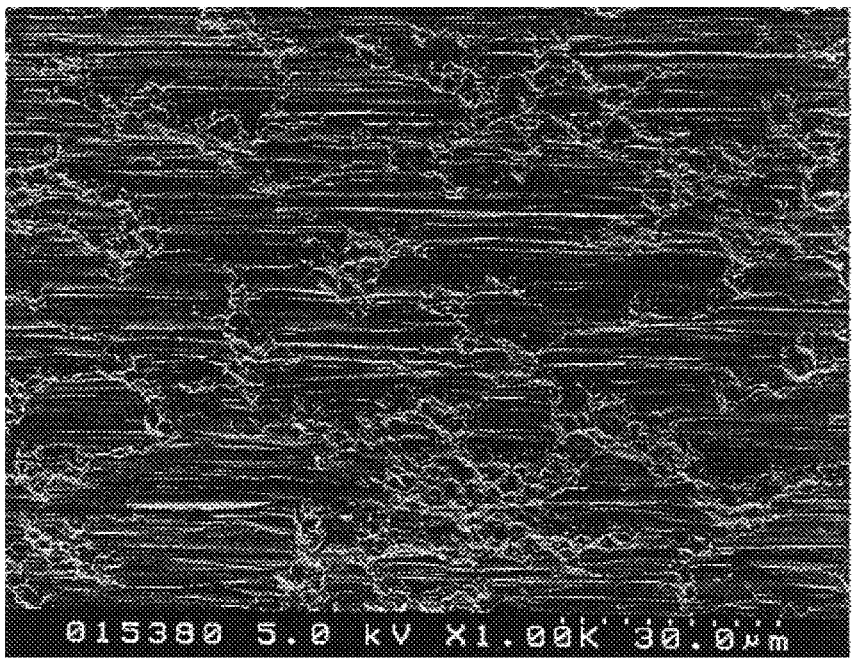
FIG. 9 is a SEM photo showing one form of the matte side having undergone the second mechanical polishing.

FIG. 8 is a SEM photo showing the matte side of the 18 μm thick electrodeposited copper foil having the matte side as shown in FIG. 7, the matte side having been buffed once. FIG. 9 is a SEM photo showing the matte side, which matte side has thus undergone the first buffing and thereafter the second buffing performed with the use of the second rotary buff whose direction of rotation is reversed from that of the first buffing.

In the present invention, the matte side of the electrodeposited copper foil is thus mechanically polished at least once, and the mechanically polished matte side is chemically polished.

As a chemical polishing solution for the mechanically polished matte side, there can be employed, for example, a nitric acid/sulfuric acid/hydrochloric acid solution (bright dip solution), a solution obtained by adding chromic acid to the bright dip solution, a nitric acid type solution, a phosphoric acid type solution, a chromic acid type solution, a sulfuric acid type solution, a hydrogen peroxide type solution, a sulfuric acid/hydrogen peroxide type solution, a copper chloride type solution, an iron chloride type solution, an ammonium persulfate type solution and an ammonia/alkali type solution.

Specific examples of the polishing solutions which can be employed in the present invention are indicated below. The respective ingredient ratios of the following polishing solutions are those typical with respect to the concerned polishing solutions.

| (1) | |
|---|---|
| nitric acid | 200 parts by volume |
| sulfuric acid | 400 parts by volume |
| hydrochloric acid | 2 parts by volume |
| water | 300 parts by volume. |
| (2) | |
| nitric acid | 320 parts by volume |
| sulfuric acid | 640 parts by volume |
| hydrochloric acid | 10 parts by volume |
| water | 640 parts by volume. |
| (3) | |
| nitric acid | 20 to 80 parts by volume |
| sulfuric acid | 20 to 80 parts by volume |
| hydrochloric acid | 0.1 to 10 parts by volume |
| chromic acid | 5 to 200 parts by volume |
| water | appropriate amount. |
| (4) | |
| phosphoric acid | 30 to 80 parts by volume |
| nitric acid | 5 to 20 parts by volume |
| glacial acetic acid | 10 to 50 parts by volume |
| water | appropriate amount. |
| (5) | |
| phosphoric acid | 500 parts by volume |
| nitric acid | 200 parts by volume |
| glacial acetic acid | 50 parts by volume |
| hydrochloric acid | 5 parts by volume |
| water | 300 parts by volume. |
| (6) | |
| phosphoric acid | 40 parts by volume |
| nitric acid | 15 parts by volume |
| hydrochloric acid | 1.5 parts by volume |
| water | 48 parts by volume |
| ammonium nitrate | 90 parts by weight. |
| (7) | |
| phosphoric acid | 45 to 60 parts by volume |
| nitric acid | 8 to 15 parts by volume |
| sulfuric acid | 15 to 25 parts by volume |
| water | 10 to 20 parts by volume. |
| (8) | |
| chromic acid | 450 parts by weight |
| sulfuric acid | 125 parts by volume |
| hydrochloric acid | 5 parts by volume |
| glacial acetic acid | 75 parts by volume |
| water | 200 parts by volume. |
| (9) | |
| sodium bichromate | 70 to 120 parts by weight |
| sulfuric acid | 100 to 200 parts by volume |
| benzotriazole | 2 to 40 parts by weight |
| water | q.s. ad 1000 parts by volume. |
| (10) | |
| hydrogen peroxide | 100 mol/lit. |
| sulfuric acid | 2 mol/lit. |
| saturated alcohol | small amount. |
| (11) | |
| hydrogen peroxide | 100 mol/lit. |
| hydrofluoric acid | 2 mol/lit. |
| saturated alcohol | small amount. |
| (12) | |
| hydrogen peroxide | 100 mol/lit. |
| nitric acid | 2 mol/lit. |
| saturated alcohol | small amount. |
| (13) | |
| nitric acid | 40 parts by volume |
| cuprous chloride | 3 parts by weight |
| glacial acetic acid | 60 parts by volume |
| potassium bichromate | 5 parts by weight |
| water | appropriate amount. |
| (14) | |
| $(NH_4)_3S_2O_2$, etc. in terms of $NH_3$ | 8.2 to 9.5N |
| Cu | 150 to 180 g/lit. |
| pure water | remainder. |

Furthermore, examples of the commercially available polishing solutions are as follows:

(15) (polishing solution produced by LMEC Inc.)

| | |
|---|---|
| DI (de ionized) pure water | 60.7 w/w % |
| sulfuric acid (62.5%) | 22.2 w/w % |
| hydrogen peroxide (35%) | 16.1 w/w % |
| Mec Power Etching HE 700 (trade name) | 1 w/w %. |

(16) (polishing solution produced by Meltex Inc.)

| | |
|---|---|
| Melpolish CU-67 (trade name) | 100 g/lit. |
| Melpolish CU-78B (trade name) | 50 ml/lit. |
| sulfuric acid (98%) | 75 ml/lit. |
| DI pure water | remainder. |

(17) (polishing solution produced by Shipley Inc.)
Chempolish 151 L-2 (trade name) solution as sold.

These chemical polishing solutions enable polishing away a desired amount of copper from the matte side by appropriately setting conditions for bringing them into contact with the matte side of the electrodeposited copper foil, for example, contact time and agitation conditions.

For example, the surface of the matte side can be converted into a desired polished form by immersing the mechanically polished matte side in the chemical polishing solution (bright dip solution) of item (1) above at ordinary temperature for 10 to 30 sec. Also, the surface of the matte side can be converted into a desired polished form by immersing the mechanically polished matte side in the chemical polishing solution of item (3) above at 50 to 80° C. for 2 to 6 min. Generally, in the polishing solution containing nitric acid/sulfuric acid/hydrochloric acid such as the bright dip solution, the reaction is vehement, so that a given level of chemical polishing can be accomplished by an immersion conducted at room temperature or temperatures close thereto for a relatively short period of time. By contrast, when a phosphoric acid based solution is employed, it is needed to contact the mechanically polished matte side with the polishing solution warmed (or heated) at ordinary temperature or higher for a relatively prolonged period of time, for example, 1 to a few minutes.

For example, referring to FIG. 3, the surface of the mechanically polished matte side can be polished nearly uniformly by contacting the mechanically polished matte side with any of the above chemical polishing solutions in the above manner. Further, for example, shelf-shape portions formed during the mechanical polishing, because of a large contact area, are substantially completely removed. Still further, these chemical polishing solutions are uniformly brought into contact with the whole surface of the matte side, and penetrate to portions which, for example, the rotary buff failed to contact during the mechanical polishing. Consequently, all the mechanically polished matte side surface is chemically polished in accordance with the area of contact with the chemical polishing solution.

Therefore, the surface having been polished by the chemical polishing operation shows a continuation of gently-sloping curve as a whole, as shown in FIG. 3. For example, when the chemical polishing is followed by treatment for roughening, uniform treating of all the matte side surface can be accomplished.

In the chemical polishing operation of the present invention, it is intended to bring the chemical polishing solution into selective contact with the mechanically polished matte side, and it is not intended to chemically polish the shiny side. Therefore, generally, before contacting the mechanically polished matte side with the chemical polishing solution, the shiny side may be masked with the use of, for example, an acidproof resin to thereby protect the shiny side from the chemical polishing. However, in the event that it is needed to chemically polish the shiny side, the masking is not effected so that the matte side and the shiny side can be simultaneously chemically polished.

The above chemical polishing accomplishes polishing of the whole matte side surface. For example, polishing is performed so as to attain a reduction of $C_1=3.2$ μm for which reference is made to FIG. 2 to $C_2=2.6$ μm for which reference is made to FIG. 3. That is, the chemical polishing causes $C_2$ for which reference is made to FIG. 3 to attain a reduction of 20% relative to the $C_0$ prior to surface polishing (FIG. 1). Thus, since the mechanical polishing as the prior operation causes $C_1$ to attain a reduction of 36% relative to $C_0$, the chemical polishing as the operation subsequent to mechanical polishing causes $C_2$ to attain a reduction of 48% relative to $C_1$. In the evaluation of the level of thus performed chemical polishing by the surface roughness changed by the chemical polishing, the average surface roughness (Rz) becomes 0.8 to 2.5 μm, preferably 1.0 to 1.8 μm. For example, with respect to the electrodeposited copper foil of FIG. 1, the original average surface roughness ($Rz_0$) is 3.6 μm, and the mechanical polishing reduces the same to an average surface roughness ($Rz_1$) of 2.0 μm as shown in FIG. 2. Thus, the mechanical polishing lowers the average surface roughness (Rz) by 47%. The chemical polishing reduces the same to an average surface roughness ($Rz_2$) of 1.5 μm as shown in FIG. 3. Thus, the chemical polishing causes the average surface roughness ($Rz_2$) to attain a reduction of 60% relative to the average surface roughness ($Rz_1$) of matte side accomplished by the mechanical polishing.

Moreover, shelf-shape portions formed during the mechanical polishing are selectively chemically polished by performing the chemical polishing after the mechanical polishing. Therefore, the whole matte side surface takes the form of a continuation of gently-sloping curved shape. Consequently, in the treatment for roughening generally conducted after the chemical polishing, uniform treating of all the matte side surface can be achieved.

Figure 10:
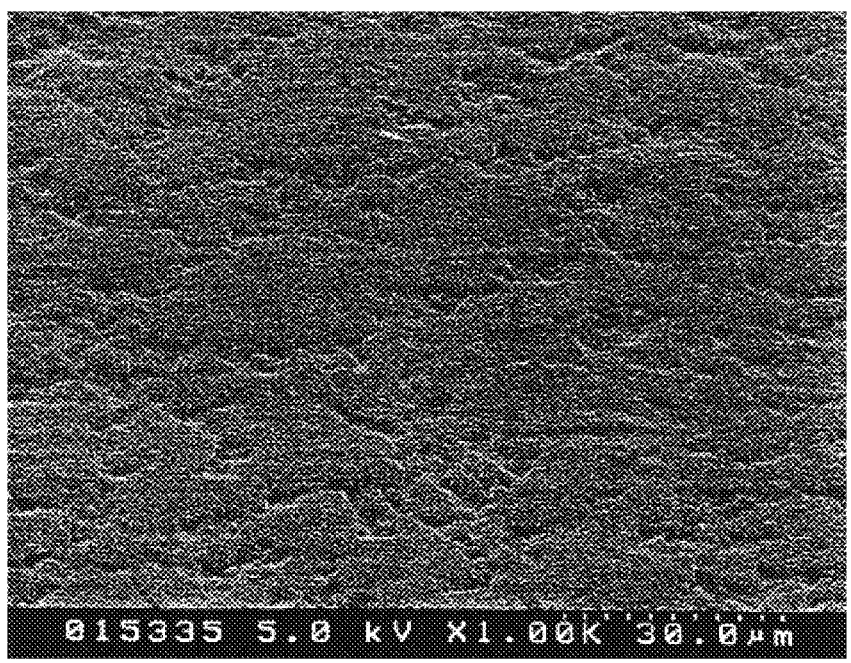
FIG. 10 is a SEM photo showing one form of the matte side having undergone the chemical polishing.

FIG. 10 is a SEM photo showing the matte side of the 18 μm thick electrodeposited copper foil having undergone the two-stage buffing and thereafter the above chemical polishing.

Assuming that the average thickness of the electrodeposited copper foil before mechanical polishing is 100%, the average thickness (gauge thickness) of the 18 μm thick electrodeposited copper foil whose matte side has thus been prepared by the mechanical polishing followed by the chemical polishing is in the range of 90 to 97%, preferably 94 to 96%, based on the average thickness 100%. These values suggest that the matte side of the electrodeposited copper foil becomes a continuation of gently sloping curved shape and that, taking into account the average surface ($Rz_1$) of the matte side before polishing, there is no conspicuous change in the thickness of electrodeposited copper foil overall. That is, most apex portions of the protrudent parts of the matte side are ground by the mechanical polishing followed by the chemical polishing according to the present invention, and streaks attributed to the mechanical polishing, such as pointed streaks often observed on the mechanically polished surface, are eliminated by the chemical polishing. Therefore, in the process of the present invention, any conspicuous decrease of strength of electrodeposited copper foil attributed to polishing would not result from the mechanical polishing followed by the chemical polishing even when use is made of an extremely thin electrodeposited copper foil (for example, average thickness: 12 to 18 μm).

Figure 5:
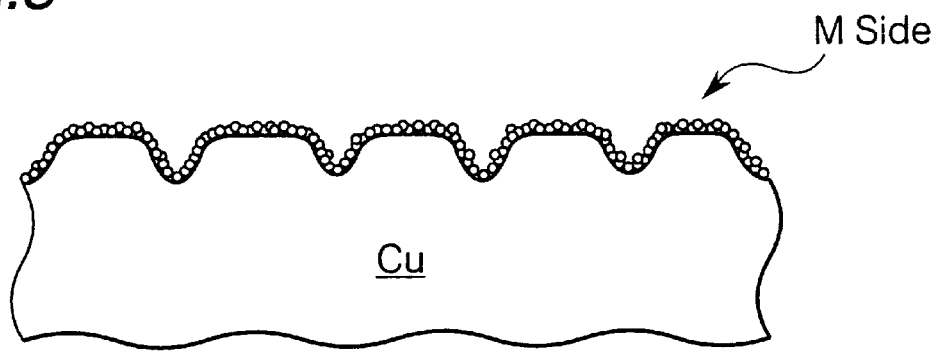
FIG. 5 is a view schematically showing the state of the electrodeposited copper foil with its surface prepared that has been treated for roughening.

In the present invention, after the above preparing of the matte side of electrodeposited copper foil by the mechanical polishing followed by the chemical polishing, it is preferred that the prepared matte side be treated for roughening as shown in FIG. 5.

This treatment sticks fine particles of copper to the thus prepared matte side. In this treatment, fine particles of copper are formed on the prepared matte side by the use of plating techniques conducted under different conditions in combination.

For maintaining-etching properties while enhancing the adherence of the copper foil to an insulating substrate, it is preferred that the mechanically polished surface of the copper foil be treated so that the average surface roughness (Rz) falls within the range of 1.5 to 4.0 μm, especially 1.5 to 3.5 μm, and still especially 1.5 to 2.5 μm. The matte side can be uniformly polished by the mechanical polishing operation followed by the chemical polishing operation, and the resultant uniform polished surface accomplishes uniform electrodeposition of fine copper particles at a high density.

This treatment comprises a sequence of burn plating, seal plating and whisker plating. This sequence of plating operations is carried out under, for example, the following conditions.

(1) Burn plating

An insoluble electrode is arranged opposite to the matte side of an electrodeposited copper foil which has been prepared by the mechanical polishing followed by the chemical polishing, and a plating is carried out under the following conditions:

copper concentration: 3 to 30 g/lit., sulfate concentration: 50 to 500 g/lit., solution temperature: 20 to 30° C., current density: 20 to 40 A/dm$^2$, and time: 5 to 15 sec.

A layer of particulate copper electrodeposits known as "burn plating" is formed on the prepared matte side of the electrodeposited copper foil by the electroplating conducted under these conditions.

(2) Seal plating

Subsequently, the surface having undergone the above burn plating is subjected to a seal plating conducted under the following conditions:

copper concentration: 40 to 80 g/lit., sulfate concentration: 50 to 150 g/lit., solution temperature: 45 to 55° C., current density: 20 to 40 A/dm$^2$, and time: 5 to 15 sec.

The above layer of particulate copper electrodeposits is coated with a thin film of copper known as "seal plating" by the plating conducted under these conditions.

(3) Whisker plating

Thereafter, the surface having undergone the above seal plating is subjected to a whisker plating conducted under the following conditions:

copper concentration: 5 to 30 g/lit., sulfate concentration: 30 to 60 g/lit., solution temperature: 20 to 30° C., current density: 10 to 40 A/dm$^2$, and time: 5 to 15 sec.

Whiskery copper deposits known as "whisker plating" are formed on the copper covering film having been formed by the above seal plating by the plating conducted under these conditions.

Figure 11:
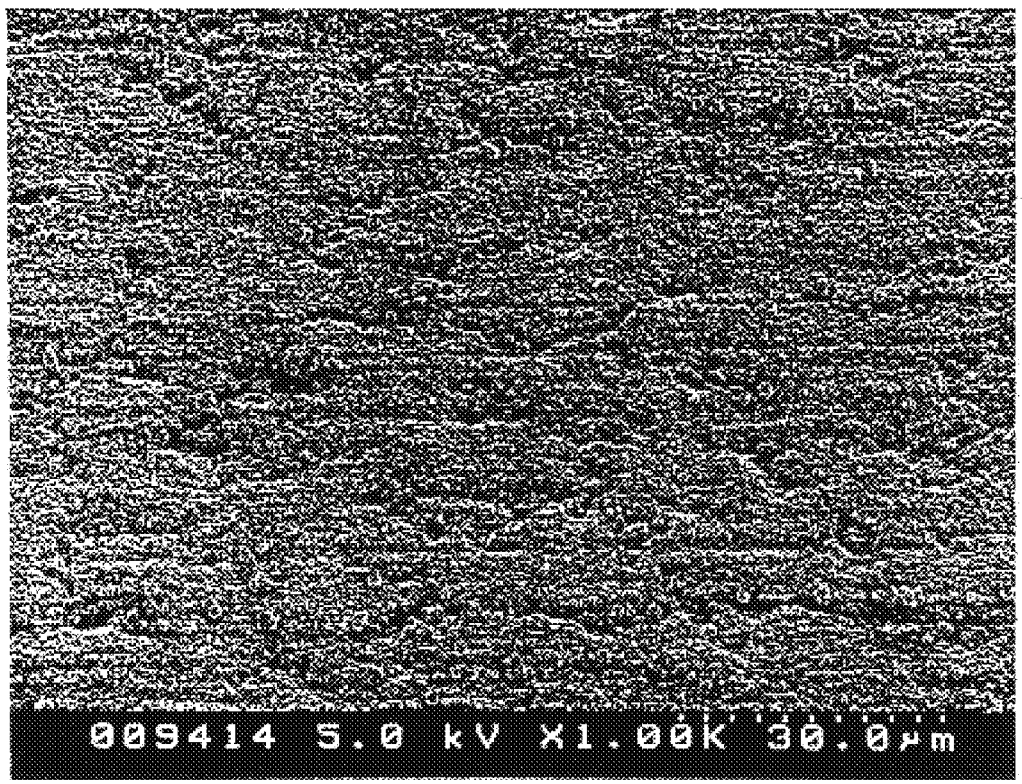
FIG. 11 is a SEM photo showing one form of the matte side of an electrodeposited copper foil with its surface prepared according to the present invention, which has been treated for roughening.

FIG. 11 is a SEM photo showing the matte side of 18 μm thick electrodeposited copper foil having undergone the above treatment.

The above describes only an example of roughening treatment, and desired nodulation can be adopted under other customarily employed roughening treatment conditions.

After the above treatment for roughening, the prepared matte side is preferably passivated. This passivation is a plating of a metal which is electrochemically baser than copper, such as zinc or chromium, to the above treated surface. For example, a thin plating layer of a metal having corrosion preventive properties for copper is formed on the treated surface.

In particular, for example, the passivation based on zinc and/or chromate can be accomplished by a sequence of operations consisting of treating an electrodeposited copper foil with its matte side surface prepared by the above mechanical polishing followed by the chemical polishing, passing the treated electrodeposited copper foil through a zinc plating bath and performing chromate treatment.

Employable zinc treatment conditions are, for example, as follows.

In the zinc treatment, the treated matte side is electroplated with zinc at a current density of 5 A/dm$^2$ for 8 sec. through, for example, a 25° C. plating solution having a zinc concentration of 5 g/lit. and a sulfate concentration of 50 g/lit.

After the formation of a zinc plating layer, the surface of the zinc plating layer is subjected to a chromate treatment.

This chromate treatment is performed by, for example, electrolyzing at a current density of 1 A/dm$^2$ for 5 sec. through a pH 4 electrolytic solution having a chromic anhydride concentration of 2 g/lit. Further, the surface having undergone the above chromate treatment is preferably coated with, for example, a silane compound such as γ-glycidoxypropyltrimethoxysilane as a silane coupling agent to thereby form a silane coupling agent layer.

When, for example, the above 18 μm thick electrodeposited copper foil is subjected to the above mechanical polishing, chemical polishing, treatment for roughening, passivation and chromate treatment, the resultant electrodeposited copper foil generally has an average thickness (gauge thickness) of 16 to 20 μm, preferably 17 to 19 μm.

The electrodeposited copper foil of the present invention (preferably, the electrodeposited copper foil with its surface prepared and treated for roughening) having undergone the passivation and chromate treatment after the treatment for roughening generally has an average thickness of 5 to 35 μm, preferably 12 to 25 μm. Assuming that the average thickness of the electrodeposited copper foil before surface preparing is 100%, the average thickness of the thus prepared electrodeposited copper foil with its surface prepared (preferably, the electrodeposited copper foil with its surface prepared and treated for roughening) is generally in the range of 90 to 97%, preferably 94 to 96%. This means that there is no conspicuous polishing loss of copper. Moreover, the average surface roughness (Rz) of the matte side of the above obtained 18 μm thick electrodeposited copper foil with its surface prepared and treated (electrodeposited copper foil with its surface prepared, obtained by performing the treatment for roughening after the polishings) is generally in the range of 1.0 to 3.0 μm, preferably 2.0 to 2.5 μm. For example, at the bonding to an insulating film through an adhesive layer, a very uniform and high bond strength can be attained therebetween.

The mechanical polishing followed by the chemical polishing not only selectively polishes protrudent parts of the matte side but also realizes the form of a continuation of gently sloping curved shape on the overall matte side surface. Extremely uniform roughening treatment (nodulation) can be obtained on this polished surface.

In the process of the present invention, the matte side of the electrodeposited copper foil is selectively mechanically polished and subsequently chemically polished. During the chemical polishing, it is common practice to mask the shiny side (average surface roughness generally ranges from about 1.2 to 2.5 $\mu$m) to prevent the surface roughness from being varied by the polishing.

A printed wiring board can be produced by laminating a substrate with the thus produced electrodeposited copper foil with its surface prepared, preferably electrodeposited copper foil with its surface prepared and treated for roughening, subsequently applying a photoresist layer to thereby effect masking and thereafter leaching excess copper to thereby form a wiring pattern on the substrate.

That is, in the printed wiring board of the present invention, a wiring pattern formed from the electrodeposited copper foil with its surface prepared, preferably the electrodeposited copper foil with its surface prepared and treated for roughening, is disposed on the surface of an insulating substrate. This electrodeposited copper foil with its surface prepared is the described one having a shiny side and a prepared matte side whose average surface roughness (Rz) is in the range of 0.8 to 2.5 $\mu$m, the above prepared matte side obtained through the steps of subjecting a matte side of electrodeposited copper foil whose average surface roughness (Rz) is in the range of 2.5 to 10 $\mu$m to at least one mechanical polishing so that the average surface roughness (Rz) of the matte side becomes in the range of 1.5 to 3.0 $\mu$m, and subjecting the matte side having undergone the mechanical polishing to a selective chemical polishing so that the average surface roughness (Rz) of the matte side becomes in the range of 0.8 to 2.5 $\mu$m.

Figure 6:
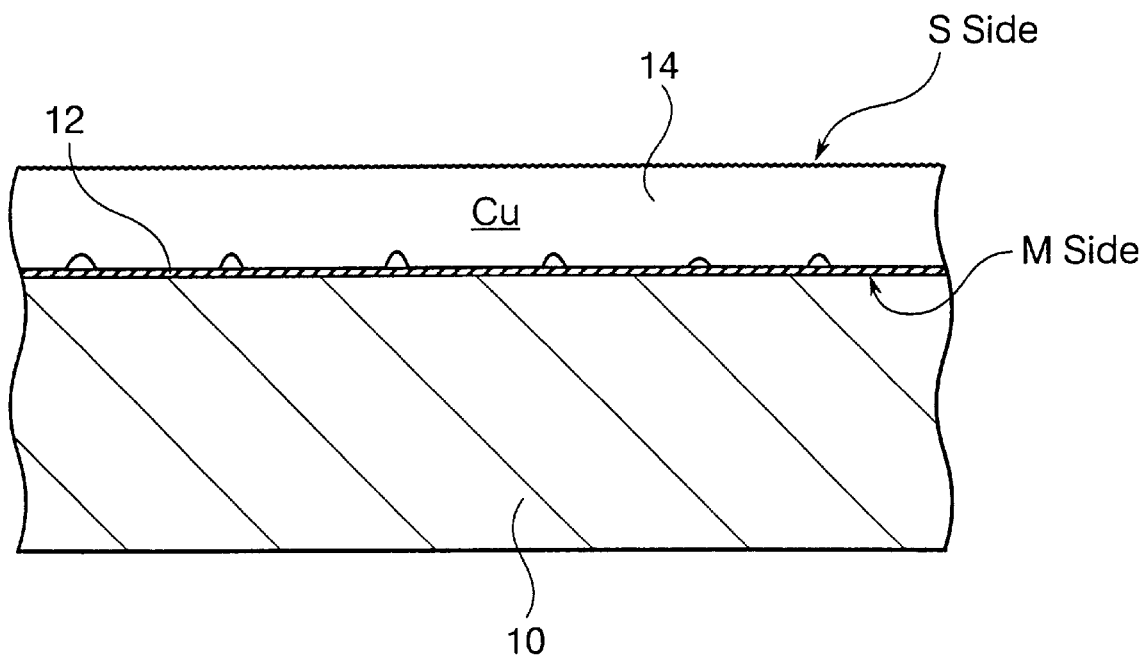
FIG. 6 is a view schematically showing the electrodeposited copper foil with its surface prepared of the present invention, having been laminated to a polyimide film.

Referring to FIG. 6, the printed wiring board of the present invention comprises insulating substrate 10 and, superimposed on at least one side thereof, wiring pattern 14. This wiring pattern can be formed by first laminating the insulating substrate with the electrodeposited copper foil with its surface prepared, preferably electrodeposited copper foil with its surface prepared and treated, through an adhesive or without the use of any adhesive, and thereafter etching the copper foil to perform desired pattern. The laminating of the insulating substrate with the electrodeposited copper foil with its surface prepared, preferably electrodeposited copper foil with its surface prepared and treated, is conducted in such a manner that the prepared matte side faces the insulating substrate.

The insulating substrate 10 can be laminated with the electrodeposited copper foil with its surface prepared (preferably electrodeposited copper foil with its surface prepared and treated) by compressing them to each other while heating with or without a thermosetting adhesive 12 interposed therebetween.

Various substrates such as a glass reinforced synthetic resin substrate and a paper reinforced synthetic resin substrate can be employed as the insulating substrate 10 for use in the present invention. It is preferred that the employed insulating substrate have a chemical resistance ensuring freedom from deterioration by chemical solutions from the viewpoint that the insulating substrate is brought into contact with an acid, etc. at the time of etching. Further, it is preferred that the insulating substrate have a heat resistance ensuring freedom from deterioration by heating made at the time of bonding of devices, etc. The insulating substrate can be produced from various resins, examples of which include a glass reinforced epoxy, a BT (Bismaleimide Triazine), polyesters, polyamides, fluororesins (e.g., Teflon (trade name)), liquid crystal polymers and polyimides. Especially in the present invention, when a flexible insulating substrate is employed as the insulating substrate, it is preferred to use a film insulating substrate composed of a polyimide.

The polyimide substrate for constituting the insulating substrate 10 can be produced from, for example, a totally aromatic polyimide synthesized from pyromellitic acid dianhydride and an aromatic diamine or a totally aromatic polyimide of biphenyl skeleton synthesized from biphenyltetracarboxylic acid dianhydride and an aromatic diamine. Especially in the present invention, a totally aromatic polyimide of biphenyl skeleton (e.g., Upilex (trade name) produced by Ube Industries, Ltd.) is preferably used as the polyimide film. When the insulating substrate in film form is used in the present invention, the thickness of the insulating substrate 10 is generally in the range of 25 to 125 $\mu$m, preferably 50 to 75 $\mu$m.

The insulating substrate 10, depending on the use thereof, may be furnished with through-holes such as device holes, sprocket holes and outer lead cut holes. These through-holes are generally formed by die punching.

The wiring pattern 14 can be formed by first laminating the above insulating substrate 10 furnished with needed holes with the electrodeposited copper foil with its surface prepared (preferably electrodeposited copper foil with its surface prepared and treated) through an insulating adhesive 12 so that the prepared matte side of the electrodeposited copper foil contacts the adhesive layer 12, subsequently applying a resist, and thereafter etching the electrodeposited copper foil with its surface prepared (preferably electrodeposited copper foil with its surface prepared and treated).

The lamination of the insulating substrate with the electrodeposited copper foil with its surface prepared (preferably electrodeposited copper foil with its surface prepared and treated) can be performed with the use of an adhesive or without any adhesive layer interposed therebetween. In the use of an adhesive, the employed adhesive 12 must have properties such as heat resistance, chemical resistance, bond strength and flexibility. For example, epoxy adhesives and phenol adhesives can be mentioned as the adhesive having these properties. These adhesives may be those modified with a urethane resin, a melamine resin, a polyvinylacetal resin and the like, and the epoxy resin per se may be one modified with a rubber. These adhesives are thermosetting. These adhesives are applied in the form of a layer whose thickness is generally in the range of 3.7 to 23 $\mu$m, preferably 10 to 21 $\mu$m. When use is made of the adhesives, the adhesive layer may be applied to the surface of the insulating substrate 10, or to the matte side of the electrodeposited copper foil with its surface prepared.

Photoresist is applied to the shiny side of the electrodeposited copper foil with its surface prepared (preferably electrodeposited copper foil with its surface prepared and treated) thus superimposed on the insulating substrate 10 by lamination. Wiring pattern is printed, and development is conducted to thereby remove excess photoresist, followed by etching. Thus, the wiring pattern 14 is obtained.

After the formation of the wiring pattern on the surface of the insulating substrate 10 in the above manner, a protective resin such as a solder resist can be applied to parts other than bonding or connecting parts (lead parts) for device bonding. After the application of the protective resin, the lead parts for device bonding are subjected to nickel/gold plating, tin plating, solder plating or gold plating. Although in most cases the protective resin is first applied and subsequently the parts not furnished with the protective resin are plated as mentioned above, it is feasible to first form a thin plating layer of the above metal on the surface of wiring pattern formed prior to the application of protective resin, next apply a protective resin and thereafter plate lead parts extending out of the protective resin, for example, in order to prevent any whisker generation and to avoid any abnormal corrosion of wiring pattern by the plating solution. This plating method is useful especially when the tin plating which is likely to invite whisker generation is employed.

After the above formation of the plating layer, device mounting can be carried out by the use of any of common methods, such as the wire bonding method, TAB (Tape Automated Bonding) method, flip chip bonding method. After the device mounting, generally, the device carrying PWB (printed wiring board) is sealed with the application of a seal resin to the devices and connected to PWB by soldering, BGA (Ball Grid Array) method, Anisotropic Conductive Film method, etc. altogether and put to practical use.

In the present invention, a multilayer laminate can be provided by laminating the above PWBs and by securing electrical connection in the direction of the laminate thickness.

That is, the multilayer printed wiring board of the present invention comprises a laminate of a plurality of boards of given thickness, each of the boards having its surface furnished with a wiring pattern, the above boards capable of being electrically connected to each other in the direction of the thickness of the laminate. The copper foil for forming the wiring pattern in the multilayer printed wiring board of the present invention is an electrodeposited copper foil with its surface prepared having a shiny side and a prepared matte side whose average surface roughness (Rz) is in the range of 0.8 to 2.5 μm, the prepared matte side obtained through the steps of subjecting a matte side of electrodeposited copper foil whose average surface roughness (Rz) is in the range of 2.5 to 10 μm to at least one mechanical polishing so that the average surface roughness (Rz) of the matte side becomes in the range of 1.5 to 3.0 μm, and subjecting the matte side having undergone the mechanical polishing to a chemical polishing so that the average surface roughness (Rz) of the matte side becomes in the range of 0.8 to 2.5 μm. In the present invention, it is especially preferred to employ an electrodeposited copper foil with its surface prepared and treated for roughening.

The electrical connection in the direction of the laminate thickness can be secured by various methods, for example, the method comprising making via holes in PWBs by, for example, a drill or laser and either depositing a conductive metal on the wall of the via holes or filling a conductive resin composition containing a conductive metal into the via holes, or the method comprising forming conductive bumps on PWBs with the utilization of printing technique and mutually connecting the conductive bumps.

The electrodeposited copper foil with its surface prepared according to the present invention is suitable for use in PWBs, such as TAB tapes, flexible printed wiring boards, multilayer printed wiring boards and rigid flex. In view of strikingly uniform preparing of the matte side together with uniform treatment thereof for roughening, the electrodeposited copper foil with its surface prepared according to the present invention is especially suitable for use as an extremely thin electrodeposited copper foil whose consumption is expected to increase in accordance with the recent trend toward fine pitch.

EFFECT OF THE INVENTION

The electrodeposited copper foil with its surface prepared according to the present invention is obtained by sequentially subjecting the matte side to the mechanical polishing and the chemical polishing. The mechanical polishing mainly polishes apex portions of the protrudent parts of the matte side, and the subsequent chemical polishing further uniformly eliminates shelf-shape deformation on the mechanically polished matte side. In the electrodeposited copper foil with its surface prepared according to the present invention, obtained by sequentially subjecting the matte side to the mechanical polishing and the chemical polishing, mechanical polishing traces formed along the mechanical polishing direction and strain layers, generated by the mechanical polishing operation, are eliminated by the chemical polishing to thereby enable forming a strikingly uniform matte side surface. Treating for roughening the thus prepared matte side of the electrodeposited copper foil with its surface prepared enables uniformly forming fine particles of copper on the matte side (electrodeposited copper foil with its surface prepared and treated). The PWB obtained by laminating, for example, an insulating substrate with the thus obtained electrodeposited copper foil with its surface prepared according to the present invention and forming the copper foil into a wiring pattern exhibits a high peel strength between the wiring pattern and the insulating substrate and further ensures an overall stable strength. Moreover, in the process of the present invention, not only are apex portions of the protrudent parts of the matte side mainly mechanically polished but also the polishing irregularity, streaks, strain, etc., resulting from the mechanical polishing, are eliminated by the chemical polishing. Thus, the copper loss by polishing is strikingly slight, and the matte side surface consisting of a continuous curved shape can be obtained.

This roughening treatment of the matte side enables performing uniform nodulating treatment of the prepared matte side. Thus, PWB capable of exhibiting high performance in adhesive strength, bonding reliability, etc. can be obtained.

In the process of the present invention, the matte side of the electrodeposited copper foil is sequentially subjected to the mechanical polishing performed under mild conditions and the chemical polishing, so that the occurrence of streaks and the like on the polished matte side can be suppressed. The streaks are generally attributed to excess polishing, and the electrodeposited copper foil of this part is thinner there than at other parts. Thus, when the electrodeposited copper foil having streaks is employed in the use of an extremely thin copper foil in accordance with the trend toward fine pitch, the mechanical strength of wiring pattern there is reduced with the result that the streak portions are likely to become the cause of failure such as open circuit. The electrodeposited copper foil with its surface prepared, produced by the process of the present invention, is free from such streaks attributed to excess polishing, so that, with respect to wiring boards such as PWB produced with the use of the prepared electrodeposited copper foil, the occurrence of defective items attributed to such an open circuit or the like is strikingly low.

Moreover, when the electrodeposited copper foil with its surface prepared according to the present invention is formed into a wiring pattern through superimposing the same on an insulating substrate by laminating or bonding after resist application and etching, the difference between upper edge width and lower edge width of the formed wiring (especially lead parts) is minute. Thus, a wiring of approximately rectangular cross section can be formed. In the use of the conventional electrodeposited copper foil, the lower edge tends to be larger and wavier than the upper edge in the formed wiring, thereby causing the cross section configuration to be trapezoidal. However, in the use of the electrodeposited copper foil with its surface prepared according to the present invention, the above trend is eliminated, and a wiring of approximately rectangular cross section can be obtained. Furthermore, the lower edge portions of the wiring are etched linearly, and there is substantially no copper residue on the insulating substrate. These characteristics, although important in, for example, inner leads as well, are especially important in output side outer leads electrically connected to liquid crystal elements, and the like. With respect to the output side outer leads electrically connected to liquid crystal elements, a plurality thereof are connected to liquid crystal pixels, and not only is the lead width thereof extremely small but also the pitch is rendered small. Accordingly, the output side outer leads are likely to suffer from insulation failure between neighboring leads. For example, even if the linearity of output side outer leads is slightly deteriorated, there is the danger of insulation failure (short circuit). Further, if the lower edge is slightly wider than the upper edge in the output side outer leads, there is the danger of insulation failure (short circuit) on the surface of the insulating substrate. Still further, even if slight copper residue exists on the insulating substrate, there is the danger of insulation failure (short circuit). In the output side outer lead parts of PWBs (especially TAB tape) connected to liquid crystal elements, etching of the copper foil must be achieved with precision equal to or higher than that for inner leads for mounting electronic components. Especially, with respect to the output side outer leads of the TAB tape for liquid crystal elements, these must be formed on an insulating substrate by etching the electrodeposited copper foil disposed on the insulating substrate by laminating, so that each of the leads is likely to have a trapezoidal cross section as compared with inner leads which extend out into device holes and under which any insulating substrate is not present. Further, due to the presence of the insulating substrate, copper residue is likely to occur. Therefore, it is believed that the achievement of fine pitch is more difficult in the output side outer leads than in the inner leads.

However, the above achievement of fine pitch in the output side outer leads can be enabled by the use of the electrodeposited copper foil with its surface prepared according to the present invention. Specifically, by virtue of the use of the electrodeposited copper foil with its surface prepared according to the present invention, not only do the output side outer leads formed by etching have a rectangular cross section (upper edge width being substantially the same as the lower edge width) but also the linearity of formed leads is high. Further, there is no copper residue on the surface of the insulating substrate. Although the particular reason for the above excellent etching properties of the electrodeposited copper foil with its surface prepared according to the present invention has not yet been elucidated, specific exertion of the above effects of the present invention would be achieved by the mechanical polishing followed by the chemical polishing.

In the electrodeposited copper foil with its surface prepared according to the present invention, as aforementioned, the matte side is highly uniformly prepared, and uniform roughening can be accomplished by treating the uniform matte side. By virtue of this uniform roughening, not only desirable bonding to an insulating substrate be attained but also device mounting on PWB can be secured by plating the thus uniformly treated surface.

As apparent from the above, the electrodeposited copper foil with its surface prepared, obtained by the process of the present invention, ensures not only high adherence to insulating substrates but also strikingly high yield of device mounting on boards.

Furthermore, the use of the electrodeposited copper foil with its surface prepared according to the present invention enables obtaining PWB and multilayer laminate PWB of stable properties.

The PWB and multilayer laminate PWB produced with the use of the electrodeposited copper foil whose matte side has been prepared according to the present invention exhibit strikingly high bondability (bonding reliability) for mounted devices.

EXAMPLE

The present invention will now be illustrated in greater detail with reference to the following Example, which in no way limits the scope of the invention.

Example 1

An electrodeposited copper foil (VLP foil) of 18 μm gauge thickness having an average surface roughness of shiny side of 1.2 μm and an average surface roughness ($Rz_j$) of matte side of 3.6 μm was provided. A SEM photo of the matte side of the VLP foil is shown in FIG. 7.

While the VLP foil was being passed through guide rolls, the matte side of the VLP foil was buffed by means of #1000 buff comprising aluminum oxide as abrasive grains (manufactured by Tsunoda Brush K.K.), arranged so that the direction of buff rotation was counter to the direction of advance of electrodeposited copper foil, under conditions such that the first-stage buff rotating speed, press force in terms of buff motor current value and line speed were 1200 μm, 19 A and 8 m/min, respectively (the first mechanical polishing).

A SEM photo of the matte side having undergone the first mechanical polishing is shown in FIG. 8.

After the first mechanical polishing of the VLP foil, the matte side having undergone the first mechanical polishing was buffed by means of #1000 buff while being rotated in the direction identical with the direction of advance of VLP foil. At this buffing, the second-stage buff rotating speed, press force in terms of buff motor current value and line speed were 1200 rpm, 1.6 A and 8 m/min, respectively (the second mechanical polishing).

The rotation current value at the time of non-load was 10 A when measured in the first buffing and 18 A when measured in the second buffing.

A SEM photo of the matte side of the VLP foil thus having undergone the two mechanical polishings is shown in FIG. 9. The average surface roughness (Rz) of the thus mechanically polished matte side was 2.0 μm, which indicated a mechanical polishing of 18% relative to the average surface roughness (Rz) of the matte side of the VLP foil prior to the mechanical polishings. As seen from FIG. 8, streaks remained on the matte side, irrespective of the performing of the twice mechanical polishings.

After the mechanical polishings, the shiny side was coated with an acidproof resin to thereby effect masking thereof.

The VLP foil whose shiny side was masked was immersed in the chemical polishing solution of the following composition and chemically polished at 30° C. for 5 sec. while the chemical polishing solution was being circulated.

Fundamental composition of chemical polishing solution

| Ingredient | Content |
|---|---|
| (1) $CuCl_2$ | 80 parts by weight |
| (2) 35% HCl | 50 parts by weight |
| (3) 30% $H_2O_2$ | 20 parts by weight |
| (4) water (q.s. ad 1000 parts by volume). | |

This chemical polishing solution was constantly in contact with the matte side by means of a circulatory chemical polishing apparatus. This circulatory chemical polishing apparatus was equipped with a built-in automatic analyzer of the composition of the chemical polishing solution. The circulatory chemical polishing apparatus was also equipped with an ingredient supplying means for restoring the composition to the fundamental composition when the composition of the chemical polishing solution had a variation of 5 to 15% relative to the fundamental composition.

After the above chemical polishing of the matte side, the VLP foil with its surface prepared was well washed with water. A SEM photo of the prepared matte side after the chemical polishing is shown in FIG. 10.

As a result of this chemical polishing, there was obtained a prepared matte side which was nearly completely free of streaks observed on mechanically polished matte sides, such as polishing directionality and shelf-shape pointed portions resulting from mechanical polishing, and which as a whole assumed the form of a continuation of curved shape. The average surface roughness (Rz) of the thus chemically polished matte side was 1.5 μm, which suggested that the chemical polishing operation achieved a polishing of 25% relative to the average surface roughness (Rz) of the matte side of the VLP foil having undergone the mechanical polishing.

The average gauge thickness of the VLP foil with its surface prepared, obtained by the mechanical polishing followed by the chemical polishing, was about 16.8 μm, while that of the VLP foil prior to mechanical polishing employed in this Example was 17.1 μm. These suggested that there was no conspicuous copper loss attributed to leaching of copper from the VLP foil.

The matte side of the VLP copper foil with its matte side surface thus prepared was treated for roughening. This treatment effected nodulation of the prepared matte side by the use, in combination, of a plurality of plating operations consisting of burn plating, seal plating and whisker plating. In this Example, the treatment was carried out by the use of plating solutions of the following compositions.

(1) Burn plating

An insoluble electrode was arranged opposite to the buffed matte side of the electrodeposited copper foil, having been prepared by the mechanical polishing followed by the chemical polishing, and electroplating was carried out under the following conditions:

copper concentration: 3 to 30 g/lit., sulfate concentration: 50 to 500 g/lit., solution temperature: 20 to 30° C., current density: 20 to 40 A/dm$^2$, and time: 5 to 15 sec.

A layer of particulate copper electrodeposits was formed on the surface of the electrodeposited copper foil with its surface prepared by the burn plating conducted under these conditions.

(2) Seal plating

After the above burn plating, a covering plating was performed under the following conditions:

copper concentration: 40 to 80 g/lit., sulfate concentration: 50 to 150 g/lit., solution temperature: 45 to 50° C., current density: 20 to 40 A/dm$^2$, and time: 5 to 15 sec.

A thin film of copper known as "seal plating" was formed by this seal plating so as to cover the copper electrodeposits having been formed by the burn plating.

(3) Whisker plating

Thereafter, the surface having undergone the above covering plating was subjected to a whisker plating conducted under the following conditions:

copper concentration: 5 to 30 g/lit., sulfate concentration: 30 to 60 g/lit., solution temperature: 20 to 30° C., current density: 10 to 40 A/dm$^2$, and time: 5 to 15 sec.

Whiskery copper deposits known as "whisker plating" were formed on the copper coating film having been formed by the above seal plating by the electroplating conducted under these conditions.

The matte side of the VLP foil having thus been polished and treated for roughening was observed through a SEM photo. A SEM photo of the matte side is shown in FIG. 11.

The average surface roughness (Rz) of the thus treated matte side was 2.5 μm. The average thickness (gauge thickness) of the electrodeposited copper foil with its surface prepared and treated in the above manner was 17.5 μm. Thus, this treatment attained a recovery to about 98% based on the average thickness of the electrodeposited copper foil. As apparent from a comparison of FIG. 7 showing the direct treatment of the matte side of the VLP foil used as a raw material to FIG. 11 showing the treatment conducted after the preparing in the above manner, strikingly uniform treatment of the matte side can be accomplished with respect to the electrodeposited copper foil with its surface prepared, obtained by the process of the present invention, for example, by the above performing of mechanical polishing, chemical polishing and treatment for roughening in sequence.

The treated side of the thus obtained electrodeposited copper foil with its surface prepared and treated for roughening was furnished with a corrosion preventive layer. This corrosion preventive layer was formed with the use of zinc. This zinc passivation was performed at a current density of 5 A/dm$^2$ for 8 sec in a 25° C. plating solution having a zinc concentration of 5 g/lit. and a sulfate concentration of 50 g/lit. The formed zinc layer was extremely thin, and the thickness thereof was generally 100 Å or less.

After the above formation of the zinc layer, an electrolytic chromating thereof was performed at a current density of 1 A/dm$^2$ for 5 sec in a pH 4 electrolytic solution having a chromic anhydride (chromium trioxide) concentration of 2 g/lit. After the chromate treatment, the surface of a chromate layer was coated with γ-glycidoxypropyltrimethoxysilane.

The thus obtained VLP foil with its surface prepared and treated (after the plating of the passivation layer, chromate layer and silane coupling agent layer) was arranged so that the prepared matte side faced one side of a 125 μm thick polyimide substrate (with a thermosetting adhesive) furnished with sprocket holes and device holes, and bonded by hot press to each other. Subsequently, a photoresist was applied to the surface of the electrodeposited copper foil with its surface prepared and treated, and exposed to radiation in desired wiring pattern. Excess photoresist was removed, and non-masked copper foil was removed by etching. Thus, a wiring pattern was formed.

The photoresist was removed, and the wiring pattern at parts other than lead ends for bonding was coated with a solder resist. Further, a tin plating layer was formed, thereby obtaining PWB.

The thus obtained PWB exhibited a strikingly low failure ratio with respect to the open circuit of the wiring pattern. Further, the wiring pattern and the polyimide substrate were bonded to each other with high stability. Still further, the tensile strength of the lead was high. A section of formed lead was observed, and was found to be rectangular. No copper residue was detected on the substrate.

Two PWBs produced in the above manner were bonded to each other with the use of an insulating resin. Subsequently, using laser, through holes were formed so that they passed through both the upper layer wiring pattern and the lower layer wiring pattern. Conductive metal was deposited on the wall of the formed through holes by the electroless plating technique to thereby enable electrical connection between the upper layer and the lower layer. The resultant multilayer laminate PWB was sealed with a resin.

The thus obtained multilayer laminate PWB exhibited a low failure ratio and possessed strikingly stable properties.

What is claimed is:

1. A process for producing an electrodeposited copper foil with its surface prepared, comprising the steps of:
   subjecting an electrodeposited copper foil having a shiny side and a matte side whose average surface roughness (Rz) is in the range of 2.5 to 10 µm to at least one mechanical polishing so that the average surface roughness (Rz) of the matte side becomes in the range of 1.5 to 3.0 µm, and
   subjecting the matte side having undergone the mechanical polishing to a selective chemical polishing so that the average surface roughness (Rz) of the matte side becomes in the range of 0.8 to 2.5 µm.

2. A process of claim 1, wherein the matte side having undergone the chemical polishing has its surface that sharp edges of the surface have been substantially eliminated.

3. A process of claim 1, wherein the mechanical polishing is performed at least twice.

4. A process of claim 1, wherein the matte side having undergone the chemical polishing is treated for roughening.

5. A process of claim 4, wherein the matte side having been treated for roughening has an average surface roughness (Rz) in the range of 1.5 to 4.0 µm.

6. A process of claim 1, wherein the electrodeposited copper foil before the mechanical polishing has an average gauge thickness of 5 to 35 µm, the electrodeposited copper foil after the mechanical polishing has an average gauge thickness of 4.5 to 34.5 µm, and the electrodeposited copper foil having undergone the chemical polishing to thereby have its surface prepared has an average gauge thickness of 4 to 34 µm.

7. A process of claim 1, wherein the matte side having undergone the chemical polishing is treated to thereby form a roughened layer, and a corrosion preventive layer is formed on the roughened layer.

8. A process of claim 7, wherein a silane coupling agent layer is formed on the corrosion preventive layer.

9. An electrodeposited copper foil with its surface prepared, having a shiny side and a prepared matte side whose average surface roughness (Rz) is in the range of 0.8 to 2.5 µm, said prepared matte side obtained through the steps of subjecting a matte side of electrodeposited copper foil whose average surface roughness (Rz) is in the range of 2.5 to 10 µm to at least one mechanical polishing so that the average surface roughness (Rz) of the matte side becomes in the range of 1.5 to 3.0 µm, and subjecting the matte side having undergone the mechanical polishing to a selective chemical polishing so that the average surface roughness (Rz) of the matte side becomes in the range of 0.8 to 2.5 µm.

10. An electrodeposited copper foil with its surface prepared of claim 9, wherein the matte side having undergone the chemical polishing has its surface that sharp edges of the surface have been substantially eliminated.

11. An electrodeposited copper foil with its surface prepared of claim 9, wherein the matte side having undergone the chemical polishing has its surface furnished with a roughened layer.

12. An electrodeposited copper foil with its surface prepared of claim 11, wherein the matte side having its surface furnished with a roughened layer has an average surface roughness (Rz) in the range of 1.5 to 4.0 µm.

13. An electrodeposited copper foil with its surface prepared of claim 9, wherein the electrodeposited copper foil before the mechanical polishing has an average gauge thickness of 5 to 35 µm, the electrodeposited copper foil after the mechanical polishing has an average gauge thickness of 4.5 to 34.5 µm, and the electrodeposited copper foil having undergone the chemical polishing to thereby have its surface prepared has an average gauge thickness of 4 to 34 µm.

14. An electrodeposited copper foil with its surface prepared of claim 9, wherein the matte side having undergone the chemical polishing has its surface furnished with a roughened layer, and a corrosion preventive layer is disposed on a surface of the roughened layer.

15. An electrodeposited copper foil with its surface prepared of claim 14, wherein a silane coupling agent layer is disposed on the corrosion preventive layer.

16. A copper-clad laminate comprising a substrate and the electrodeposited copper foil with its surface prepared of claim 9, wherein the electrodeposited copper foil with its surface prepared is laminated on the substrate.

17. A printed wiring board comprising an insulating substrate having its surface furnished with a wiring pattern formed from an electrodeposited copper foil with its surface prepared, said electrodeposited copper foil with its surface prepared having a shiny side and a prepared matte side whose average surface roughness (Rz) is in the range of 0.8 to 2.5 µm, said prepared matte side obtained through the steps of subjecting a matte side of electrodeposited copper foil whose average surface roughness (Rz) is in the range of 2.5 to 10 µm to at least one mechanical polishing so that the average surface roughness (Rz) of the matte side becomes in the range of 1.5 to 3.0 µm, and subjecting the matte side having undergone the mechanical polishing to a chemical polishing so that the average surface roughness (Rz) of the matte side becomes in the range of 0.8 to 2.5 µm.

18. A printed wiring board of claim 17, wherein the matte side of the electrodeposited copper foil having undergone the chemical polishing has its surface that sharp edges of the surface have been substantially eliminated.

19. A printed wiring board of claim 17, wherein the matte side of the electrodeposited copper foil having undergone the chemical polishing is treated for roughening.

20. A multilayer printed wiring board comprising a laminate of a plurality of boards of given thickness, said boards capable of being electrically connected to each other in the direction of the thickness of the laminate, each of said boards having its surface furnished with a wiring pattern formed from an electrodeposited copper foil with its surface prepared, said electrodeposited copper foil with its surface prepared having a shiny side and a prepared matte side whose average surface roughness (Rz) is in the range of 0.8 to 2.5 μm, said prepared matte side obtained through the steps of subjecting a matte side of electrodeposited copper foil whose average surface roughness (Rz) is in the range of 2.5 to 10 μm to at least one mechanical polishing so that the average surface roughness (Rz) of the matte side becomes in the range of 1.5 to 3.0 μm, and subjecting the matte side having undergone the mechanical polishing to a chemical polishing so that the average surface roughness (Rz) of the matte side becomes in the range of 0.8 to 2.5 μm.

21. A multi-layer printed wiring board of claim 20, wherein the matte side of the electrodeposited copper foil having undergone the chemical polishing has its surface that sharp edges of the surface have been substantially eliminated.

22. A multilayer printed wiring board of claim 20, wherein the matte side of the electrodeposited copper foil having undergone the chemical polishing is treated for roughening.

23. A process of claim 3, wherein the matte side having undergone the chemical polishing is treated for roughening.

24. A process of claim 3, wherein the electrodeposited copper foil before the mechanical polishing has an average gauge thickness of 5 to 35 μm, the electrodeposited copper foil after the mechanical polishing has an average gauge thickness of 4.5 to 34.5 μm, and the electrodeposited copper foil having undergone the chemical polishing to thereby have its surface prepared has an average gauge thickness of 4 to 34 μm.

25. A process of claim 2, wherein the matte side having undergone the chemical polishing is treated to thereby form a roughened layer, and a corrosion preventive layer is formed on the roughened layer.

26. A process of claim 3, wherein the matte side having undergone the chemical polishing is treated to thereby form a roughened layer, and a corrosion preventive layer is formed on the roughened layer.

27. A process of claim 4, wherein the matte side having undergone the chemical polishing is treated to thereby form a roughened layer, and a corrosion preventive layer is formed on the roughened layer.

28. An electrodeposited copper foil with its surface prepared of claim 11, wherein the matte side having undergone the chemical polishing has its surface furnished with a roughened layer, and a corrosion preventive layer is disposed on a surface of the roughened layer.

29. A copper-clad laminate comprising a substrate and the electrodeposited copper foil with its surface prepared of claim 10, wherein the electrodeposited copper foil with its surface prepared is laminated on the substrate.

30. A copper-clad laminate comprising a substrate and the electrodeposited copper foil with its surface prepared of claim 11, wherein the electrodeposited copper foil with its surface prepared is laminated on the substrate.

31. A copper-clad laminate comprising a substrate and the electrodeposited copper foil with its surface prepared of claim 12, wherein the electrodeposited copper foil with its surface prepared is laminated on the substrate.

32. A copper-clad laminate comprising a substrate and the electrodeposited copper foil with its surface prepared of claim 13, wherein the electrodeposited copper foil with its surface prepared is laminated on the substrate.

33. A copper-clad laminate comprising a substrate and the electrodeposited copper foil with its surface prepared of claim 14, wherein the electrodeposited copper foil with its surface prepared is laminated on the substrate.

34. A copper-clad laminate comprising a substrate and the electrodeposited copper foil with its surface prepared of claim 15, wherein the electrodeposited copper foil with its surface prepared is laminated on the substrate.

* * * * *

UNITED STATES PATENT AND TRADEMARK OFFICE
CERTIFICATE OF CORRECTION

PATENT NO.    : 6,475,638 B1                                               Page 1 of 1
DATED         : November 5, 2002
INVENTOR(S)   : Masakazu Mitsuhashi et al.

It is certified that error appears in the above-identified patent and that said Letters Patent is hereby corrected as shown below:

Column 11,
First line of text, "LMEC Inc." should read -- MEC Inc. --.

Column 20,
Line 23, "$(Rz_j)$" should read -- $(Rz_1)$ --.
Lines 34-35, "1200 $\mu$m" should read -- 1200 rpm --.

Signed and Sealed this

Third Day of June, 2003

JAMES E. ROGAN
*Director of the United States Patent and Trademark Office*